(12) United States Patent
Karaulanov et al.

(10) Patent No.: US 11,137,454 B2
(45) Date of Patent: Oct. 5, 2021

(54) METHODS AND APPARATUSES RELATED TO MAGNETIC RELAXOMETRY MEASUREMENTS IN THE PRESENCE OF ENVIRONMENTAL RESPONSE TO MAGNETIC EXCITATION

(71) Applicant: Imagion Biosystems Inc., San Diego, CA (US)

(72) Inventors: Todor Karaulanov, Boulder, CO (US); Giulio D Paciotti, Albuquerque, NM (US)

(73) Assignee: Imagion Biosystems, Inc., San Diego, CA (US)

( * ) Notice: Subject to any disclaimer, the term of this patent is extended or adjusted under 35 U.S.C. 154(b) by 259 days.

(21) Appl. No.: 16/496,428

(22) PCT Filed: Apr. 2, 2018

(86) PCT No.: PCT/US2018/025702
§ 371 (c)(1),
(2) Date: Sep. 21, 2019

(87) PCT Pub. No.: WO2018/187217
PCT Pub. Date: Oct. 11, 2018

(65) Prior Publication Data
US 2021/0109167 A1    Apr. 15, 2021

Related U.S. Application Data

(60) Provisional application No. 62/480,491, filed on Apr. 2, 2017.

(51) Int. Cl.
G01R 33/00 (2006.01)
G01R 33/02 (2006.01)
G01R 33/12 (2006.01)

(52) U.S. Cl.
CPC ..... G01R 33/0213 (2013.01); G01R 33/1276 (2013.01)

(58) Field of Classification Search
CPC ............... G01R 33/00; G01R 33/0035; G01R 33/0023; G01R 33/0017; G01R 31/3191;
(Continued)

(56) References Cited

U.S. PATENT DOCUMENTS 6,630,829 B1 * 10/2003 Liu ..................... G01R 33/385
324/318
2013/0335088 A1 * 12/2013 Terada ................. G01R 33/385
324/322
(Continued)

FOREIGN PATENT DOCUMENTS

WO    WO2011/151049    12/2011
WO    WO2016/134436    9/2016

Primary Examiner — Jermele M Hollington
Assistant Examiner — Taqi R Nasir
(74) Attorney, Agent, or Firm — V Gerald Grafe

(57) ABSTRACT

Example embodiments of the present invention provide a magnetic relaxometry measurement apparatus, comprising: a magnetizing system configured to supply a pulsed magnetic fields to a sample; a sensor system configured to detect magnetic fields produced by induced magnetization of the sample after a magnetic field pulse from the magnetizing system; one or more compensating coils configured to suppress generation of eddy currents in an environment surrounding the apparatus due to the pulsed magnetic fields.

17 Claims, 2 Drawing Sheets

(58) Field of Classification Search
CPC ......... G01B 7/004; G01C 17/38; G06F 3/017;
G06F 3/0346; G06F 3/012
See application file for complete search history.

(56) References Cited

U.S. PATENT DOCUMENTS

2014/0084925 A1* 3/2014 Nieminen ............ G01R 33/583
324/309
2015/0369887 A1* 12/2015 Karaulanov ....... G01R 33/1276
324/301

* cited by examiner

METHODS AND APPARATUSES RELATED TO MAGNETIC RELAXOMETRY MEASUREMENTS IN THE PRESENCE OF ENVIRONMENTAL RESPONSE TO MAGNETIC EXCITATION

CROSS-REFERENCE TO RELATED APPLICATIONS

This application is a national stage application under 35 U.S.C. 371 of PCT application PCT/US2018/025702, filed 2 Apr. 2018, which claims priority to U.S. provisional application 62/480,491, filed 2 Apr. 2017. Each of the foregoing is incorporated by reference herein.

TECHNICAL FIELD

The subject invention relates to the field of magnetic relaxometry measurements, specifically the use of extra coils to reduce undesirable effects of magnetic fields from the environment surrounding the measurement.

BACKGROUND ART

Measurement of the magnetic relaxation of superparamagnetic nanoparticles has been proposed for use in a variety of applications, including several biological and medical applications. See, e.g., patent application U.S. Ser. No. 13/870,925; U.S. Ser. No. 13/249,994; U.S. Ser. No. 11/940,673; U.S. Ser. No. 12/337,554; U.S. Ser. No. 11/957,988; PCT/US2010/051417; PCT/US2010/055729; and PCT/US2011/28746; each of which is incorporated herein by reference.

At least two distinct types of environmental influences can affect measurements of magnetic relaxation of superparamagnetic nanoparticles. A first influence is environmental noise (including urban noise), which is not produced by the detection/excitation superparamagnetic relaxation (SPMR) measurement protocol itself. This noise includes contributions from sub-Hz frequencies up to high-order line harmonics. Such noise can be suppressed by magnetic and RF shielding, which typically involve magnetically and radio frequency shielded rooms or enclosures. Such noise can also be suppressed by active shielding.

A second type of noise is produced by the response of the environment to the magnetic excitation pulse that is part of the SPMR protocol itself. The present invention provides methods and apparatuses that can effectively mitigate this type of noise.

SUMMARY OF INVENTION

Example embodiments of the present invention provide a magnetic relaxometry measurement apparatus, comprising: a magnetizing system configured to supply a pulsed magnetic fields to a sample; a sensor system configured to detect magnetic fields produced by induced magnetization of the sample after a magnetic field pulse from the magnetizing system; one or more compensating coils configured to suppress generation of eddy currents in an environment surrounding the apparatus due to the pulsed magnetic fields.

In some embodiments, the one or more compensating coils comprise a first z-axis coil mounted above the magnetizing system and configured to supply a first z-axis magnetic field oriented generally vertically and coaxial with a vertical component of the magnetizing system field.

In some embodiments, the one or more compensating coils further comprise a second z-axis coil mounted beneath the magnetizing system and configured to supply a second z-axis magnetic field oriented generally vertically and coaxial with a vertical component of the magnetizing system field.

In some embodiments, the one or more compensating coils comprise a first x-axis coil mounted to one side of the magnetizing system and configured to supply a first x-axis magnetic field oriented generally horizontally and orthogonal to a vertical component of the magnetizing system field.

In some embodiments, the one or more compensating coils comprise a second x-axis coil mounted to one side of the magnetizing system, opposite the first x-axis coil, and configured to supply a second x-axis magnetic field oriented generally horizontally and orthogonal to a vertical component of the magnetizing system field.

In some embodiments, the one or more compensating coils comprise a first y-axis coil mounted to one side of the magnetizing system, 90 degrees from the first x-axis coil, and configured to supply a first y-axis magnetic field oriented generally horizontally and orthogonal to a vertical component of the magnetizing system field and orthogonal to the first x-axis magnetic field.

In some embodiments, the one or more compensating coils comprise a second y-axis coil mounted to one side of the magnetizing system, 90 degrees from the first x-axis coil, and configured to supply a second y-axis magnetic field oriented generally horizontally and orthogonal to a vertical component of the magnetizing system field and orthogonal to the first x-axis magnetic field.

In some embodiments, the one or more compensating coils comprise a second x-axis coil mounted to one side of the magnetizing system, opposite the first x-axis coil, and configured to supply a second x-axis magnetic field oriented generally horizontally and orthogonal to a vertical component of the magnetizing system field.

In some embodiments, the magnetizing system is configured to provide a magnetizing pulse sequence comprising an applied magnetization field of a first magnitude for a first time, and of a second magnitude for a second time, and wherein the one or more compensating coils are configured to provide a compensating pulse sequence comprising a third magnitude for a third time, and of a fourth magnitude for a fourth time. In some embodiments, the third magnitude is up to 50% of the first magnitude, and the fourth magnitude is up to 50% of the second magnitude. In some embodiments, the second magnitude is zero. In some embodiments, the third time is equal to the first time, and the fourth time is equal to the second time. In some embodiments, the first time is equal to 0.75 seconds, and the second time is equal to 2.25 seconds. The third time can be contemporaneous with the first time, or can be delayed, for example by 1 to 5 milliseconds. In some embodiments, the second time is greater than the first time. In some embodiments, the second time is less than the first time. In some embodiments, the third magnitude is up to 50% of the first magnitude, and the fourth magnitude is up to 50% of the second magnitude.

Example embodiments of the present invention provide a method of making a magnetic relaxometry measurement, comprising providing an apparatus as described herein, using the magnetizing system to provide magnetization pulse sequence consisting of a magnetizing field on for a first time and off for a second time, using the one or more compensating coils to provide a compensation pulse on for a third time and off for a fourth time, and using the sensor system to detect a magnetization of the sample during the second time.

DESCRIPTION OF EMBODIMENTS AND INDUSTRIAL APPLICABILITY

The present invention can be useful in magnetic relaxometry methods and apparatuses like those described in patent application U.S. Ser. No. 13/870,925; U.S. Ser. No. 13/249,994; U.S. Ser. No. 11/940,673; U.S. Ser. No. 12/337,554; U.S. Ser. No. 11/957,988; PCT/US2010/051417; PCT/US2010/055729; and PCT/US2011/28746; each of which is incorporated herein by reference. Detailed examples of magnetic relaxometry systems and methods are presented in the referenced patents and applications, and are not repeated herein though the present description relies on the understanding of one skilled in the art after examination of the referenced patents and applications.

An SPMR measurement performed on a sample of superparamagnetic nanoparticles generally includes application of a pulsed magnetic field $B^M$ after which the magnetic Neel relaxation of the nanoparticles is detected by sensors such as sensitive magnetometers or magnetic gradiometers. The field temporal gradient $dB^M/dt$ during pulse switching induces Eddy currents in the surrounding environment which can be dependent on the size, structure, composition and form of the surrounding conducting environment, and can persist long enough to create a signal in the time or frequency band of the SPMR measurement. The pulsed magnetic field can also cause certain magnetic materials to acquire time varying magnetization or a remnant one.

Figure 1:
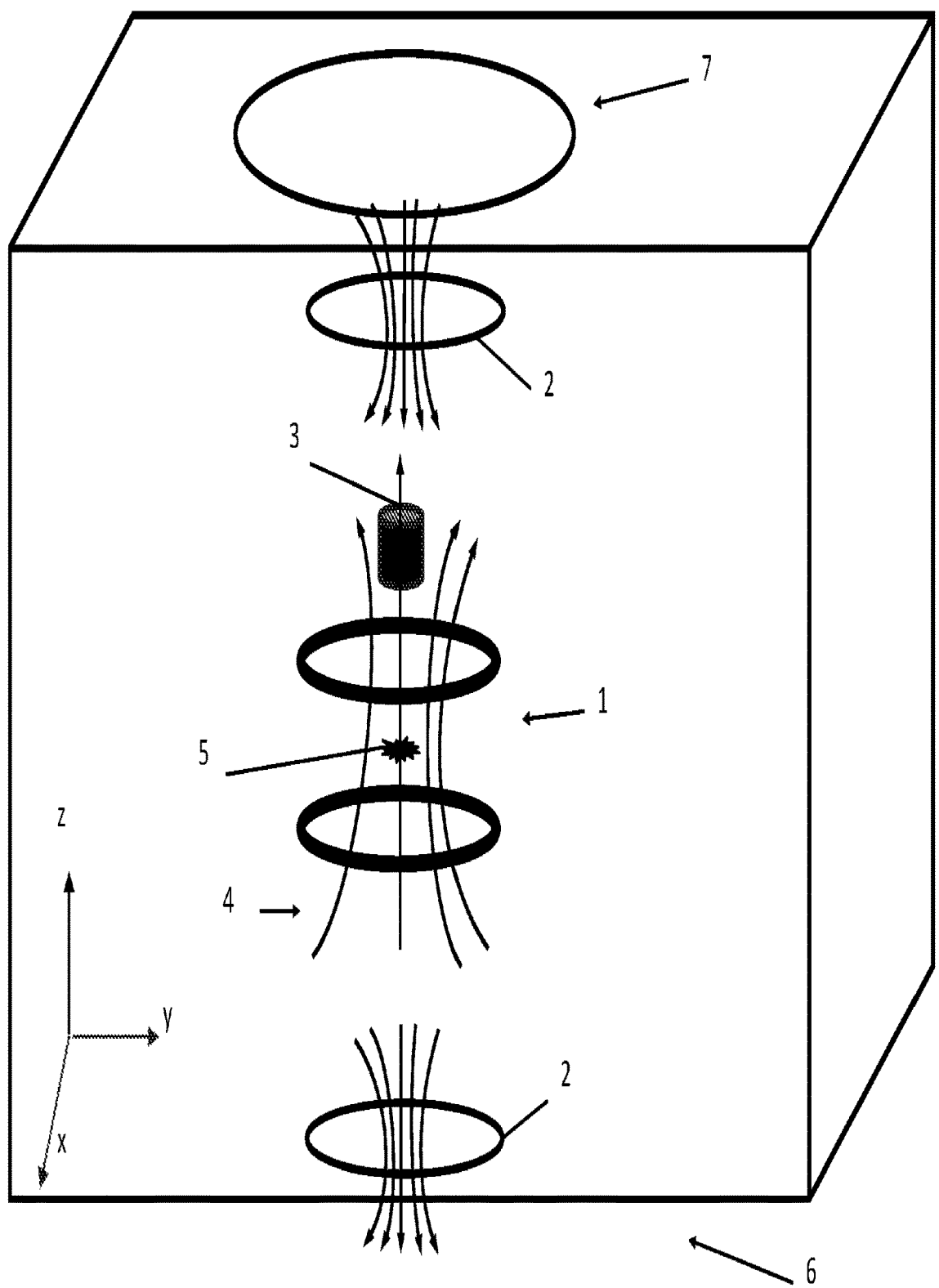
FIG. 1 is a schematic illustration of an example embodiment of the present invention.

To address the Eddy currents formation, example embodiments of the present invention provide a system as depicted in FIG. 1 for active magnetic field compensation. The system comprises one or more temporal gradient coils 2 (two coaxial coils are shown in the figure; a single coil can be suitable, as can multiple coils disposed on different axes) that act mainly on the conductive environment by compensating the induced temporal gradient by the main magnetizing coils 1 thus producing a vanishing temporal magnetic field gradient at multiple parts of the conductive environment, as an example at as many parts of the conductive environment as possible. The temporal gradient coils are also referred to as compensating coils herein. It is generally desirable that the temporal gradient coils 2 not affect the measurement on the superparamagnetic nanoparticles sample. The sample containing the nanoparticle can be of any kind—nanoparticle phantoms, tissue, organ, cells, tumors containing nanoparticle, and others.

FIG. 1 is a schematic illustration of a typical magnetorelaxometry measurement system for measuring nanoparticles, with the addition of temporal gradient coils 2. A main magnetizing coil system 1 produces a magnetic field pulse in the positive z-axis direction for the magnetization of the nanoparticle sample 5. The following SPMR of the nanoparticle is measured by magnetic sensor(s) 3. The switching magnetic field from the main magnetizing coil system induces Eddy currents in the surrounding conductive environment 6 which in turn produces magnetic field also detected by the sensor(s) 3.

The example embodiment provides temporal gradient coils 2 that can suppress the generation of Eddy currents. The system can be placed in communication with a power system (not shown in the figure) configured to supply electrical current to the temporal gradient coils 2 and a control system to control the timing and power of the electrical current, in cooperation with control of the rest of the magnetorelaxometry measurement system. The temporal gradient coils 2 generate one or more magnetic field pulses with direction (coil system axis) at an angle to the $B^M$ (depicted in FIG. 1 with an angle of 180 degrees, or opposite direction to $B^M$). The magnetic pulse sequence of the temporal gradient coils 2 can be adjustable but in general is close to the $B^M$ pulse sequence. The spatial position, the size of the coil system, and the strength of the magnetic field and temporal gradient of the temporal gradient coils 2 are chosen such that a small (in some applications a vanishingly small) temporal gradient is created in the conductive environment 7 thus suppressing the transient magnetic signal introduced in the magnetic sensor 3. Note that the example on FIG. 1 shows one side of z-axis compensation of $dB^M/dt$ (upper coil 2) but it can be applied also to the bottom part of coil system 2 as well as to the x- and y-axes (simultaneous or not) or in general in any desired direction, depending as examples on the characteristics of the conductive environment. Reducing the magnetic transient signal into the detector(s) lowers the effective background signal of the SPMR measurement on nanoparticle samples thus improving the sensitivity and lower detection level of SPMR Instrument.

The present invention comprises temporal gradient coils as described herein, magnetic relaxometry systems including temporal gradient coils as described herein, and methods of operating such systems and methods of making magnetic relaxometry measurements using such systems.

An example embodiment comprises a Helmholz coil system having first and second square coils each having sides of between 50 cm and 70 cm, nominally 60 cm, corresponding to the coils 1 in FIG. 1. The embodiment further comprised a single temporal gradient coil of similar size, corresponding to only the upper temporal gradient coil 2 in FIG. 1. The separation between the upper of the two Helmholtz coils and the temporal gradient coil was between 4 and 9 feet, for example adjustable between 5 and 8 feet. The Helmholtz coil system was configured to produce a magnetic field of 50 Gauss to 70 Gauss, for example 60 Gauss, homogeneous field at its center while the temporal gradient coil was configured to produce a magnetic field of up to 35 Gauss, for example 20 Gauss, at its center.

The temporal gradient coil was configured such that the product of the current supplied and the number of turns, and the exact position above the Helmholtz system, produced Eddy currents in conductive environmental components that at least partially counteracted those produced by the Helmholtz system due to pulsing of the field in the Helmholtz coil system. The examples given above were suitable for the environment surrounding the example embodiment. Other environments, e.g., building construction style; amount and type of metal embedded in walls, ceiling, and floor; other metal in the room; distances between the coils and the features in the environment; can indicate that different temporal gradient coil configurations, or different magnetization, or both, are desirable.

In a magnetic relaxometry measurement using the example embodiment, the Helmholtz coil system was operated with up to one second current pulse with fast switching of the current (less than 2 milliseconds from off to full current), corresponding to about one second of magnetization from the Helmholtz coil system; followed by 2 to 3 seconds of zero current applied, corresponding to no magnetization from the Helmholtz coil system. Other timing can be suitable, e.g., 0.75 seconds magnetization followed by 2.25 seconds of no magnetization. The temporal gradient coil system was operated with a similar pulse timing sequence. The temporal gradient coil system can also be operated with a phase shift or time delay between the Helmholtz coil system and the temporal gradient coil system. The temporal gradient coil system can also be operated with similar overall timing but with a shorter current on (magnetization) time for the temporal gradient coil system as compared with that of the Helmholtz coil system.

Figure 2:
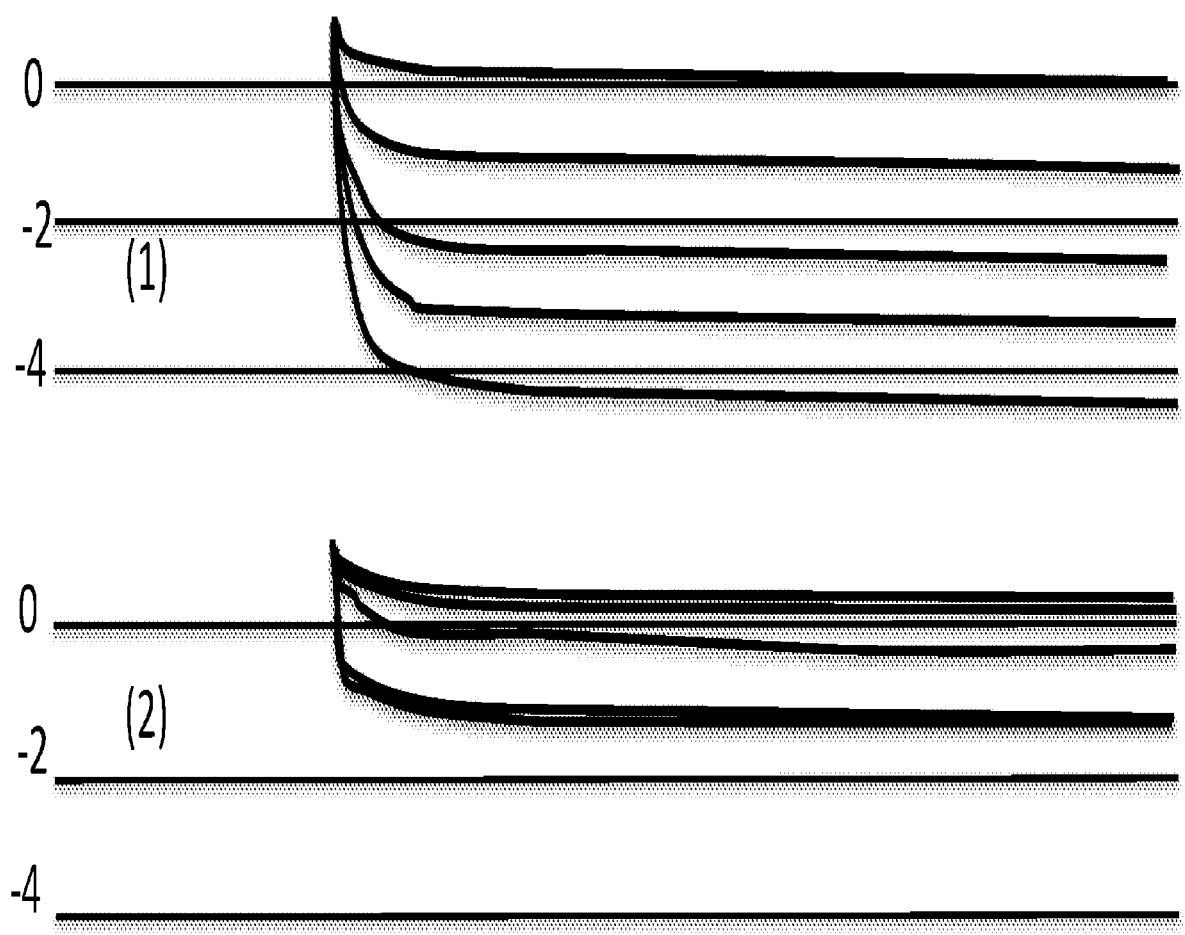
FIG. 2 is an illustration of measurement performance obtained using an example embodiment of the present invention.

FIG. 2 illustrates benefits obtained in making magnetic relaxometry measurements using the example embodiment. The upper curves 1 in the figure correspond to measurements made without the temporal gradient coil in operation, and the lower curves 2 in the figure correspond to measurements made with the temporal gradient coil in operation. There are seven curves in each portion of the figure; note that some may overlap. The curves represent the voltages produced by seven second-order SQUID axial gradiometers measuring the magnetic response of the environment. Note also that the vertical shift of each channel and noise are different due to gradiometer positions and different intrinsic balance of each gradiometer. The minimization of the environmental relaxation has led to improvement in the lower limit of detection of superparamagnetic nanoparticles by up to a factor of four.

The present invention has been described as set forth herein in relation to various example embodiments and design considerations. It will be understood that the above description is merely illustrative of the applications of the principles of the present invention, the scope of which is to be determined by the claims viewed in light of the specification. Other variants and modifications of the invention will be apparent to those of skill in the art.

We claim:

1. A magnetic relaxometry measurement apparatus, comprising:
   a magnetizing system configured to supply to a sample a magnetic field having a first magnitude during a first time period and a second magnitude during a second time period, where the first time period is long enough to magnetize particles in the sample and the second time period is longer than the time required for Brownian motion of magnetic particles that are not bound to the sample to randomize the net magnetic field of such particles;
   a sensor system configured to, after the first time period, detect magnetic fields representative of the magnetization of particles that are bound to the sample;
   one or more compensating coils configured to suppress generation of eddy currents in an environment surrounding the apparatus due to the magnetic field produced by the magnetizing subsystem.

2. An apparatus as in claim 1, wherein the one or more compensating coils comprise a first z-axis coil mounted above the magnetizing system and configured to supply a first z-axis magnetic field oriented generally vertically and coaxial with a vertical component of the magnetizing system magnetic field.

3. An apparatus as in claim 2, wherein the one or more compensating coils further comprise a second z-axis coil mounted beneath the magnetizing system and configured to supply a second z-axis magnetic field oriented generally vertically and coaxial with a vertical component of the magnetizing system magnetic field.

4. An apparatus as in claim 1, wherein the one or more compensating coils comprise a first x-axis coil mounted to one side of the magnetizing system and configured to supply a first x-axis magnetic field oriented generally horizontally and orthogonal to a vertical component of the magnetizing system magnetic field.

5. An apparatus as in claim 4, wherein the one or more compensating coils comprise a second x-axis coil mounted to one side of the magnetizing system, opposite the first x-axis coil, and configured to supply a second x-axis magnetic field oriented generally horizontally and orthogonal to a vertical component of the magnetizing system magnetic field.

6. An apparatus as in claim 4, wherein the one or more compensating coils comprise a first y-axis coil mounted to one side of the magnetizing system, 90 degrees from the first x-axis coil, and configured to supply a first y-axis magnetic field oriented generally horizontally and orthogonal to a vertical component of the magnetizing system magnetic field and orthogonal to the first x-axis magnetic field.

7. An apparatus as in claim 6, wherein the one or more compensating coils comprise a second y-axis coil mounted to one side of the magnetizing system, 90 degrees from the first x-axis coil, and configured to supply a second y-axis magnetic field oriented generally horizontally and orthogonal to a vertical component of the magnetizing system magnetic field and orthogonal to the first x-axis magnetic field.

8. An apparatus as in claim 7, wherein the one or more compensating coils comprise a second x-axis coil mounted to one side of the magnetizing system, opposite the first x-axis coil, and configured to supply a second x-axis magnetic field oriented generally horizontally and orthogonal to a vertical component of the magnetizing system magnetic field.

9. An apparatus as in claim 1, wherein the one or more compensating coils are configured to provide a compensating pulse sequence comprising a third magnitude during a third time period, and of a fourth magnitude during a fourth time period.

10. An apparatus as in claim 9, wherein the third magnitude is 50% of the first magnitude, and the fourth magnitude is 50% of the second magnitude.

11. An apparatus as in claim 10, wherein the second magnitude is zero.

12. An apparatus as in claim 9, wherein the third time period is equal to the first time period, and the fourth time period is equal to the second time period.

13. An apparatus as in claim 9, wherein the first time period is equal to 0.75 seconds, and the second time period is equal to 2.25 seconds.

14. An apparatus as in claim 9, wherein the second time period is greater than the first time period.

15. An apparatus as in claim 9, wherein the second time period is less than the first time period.

16. An apparatus as in claim 14, wherein the third magnitude is 50% of the first magnitude, and the fourth magnitude is 50% of the second magnitude.

17. An apparatus as in claim 14, wherein the third magnitude is 50% of the first magnitude, and the fourth magnitude is 50% of the second magnitude.

* * * * *